(12) United States Patent
Cusin et al.

(10) Patent No.: US 9,740,174 B2
(45) Date of Patent: Aug. 22, 2017

(54) METHOD FOR FABRICATION OF A SILICON-BASED COMPONENT WITH AT LEAST ONE OPTICAL ILLUSION PATTERN

(71) Applicant: Nivarox-FAR S.A., Le Locle (CH)

(72) Inventors: Pierre Cusin, Villars-Burquin (CH); Alex Gandelhman, Neuchatel (CH); Michel Musy, Orpund (CH)

(73) Assignee: Nivarox-FAR S.A., Le Locle (CH)

( * ) Notice: Subject to any disclaimer, the term of this patent is extended or adjusted under 35 U.S.C. 154(b) by 0 days.

(21) Appl. No.: 15/339,249

(22) Filed: Oct. 31, 2016

(65) Prior Publication Data
US 2017/0131684 A1 May 11, 2017

(30) Foreign Application Priority Data

Nov. 11, 2015 (EP) ..................................... 15194156

(51) Int. Cl.
*B44C 1/22* (2006.01)
*G04B 45/00* (2006.01)
*G04B 19/04* (2006.01)

(52) U.S. Cl.
CPC ....... *G04B 45/0076* (2013.01); *G04B 19/042* (2013.01)

(58) Field of Classification Search
USPC ....................................................... 216/2, 28
See application file for complete search history.

(56) References Cited

U.S. PATENT DOCUMENTS

| 4,725,511 A | 2/1988 | Reber |
| 8,314,989 B1 * | 11/2012 | Mossberg ............ G02B 5/1819 359/567 |
| 9,025,247 B1 | 5/2015 | Mossberg et al. |
| 2008/0198702 A1 | 8/2008 | Meister et al. |

FOREIGN PATENT DOCUMENTS

| EP | 1 722 281 A1 | 11/2006 |
| EP | 2 784 600 A2 | 1/2014 |

OTHER PUBLICATIONS

European Search Report issued Apr. 26, 2016 in European Application 15194156.4 filed on Nov. 11, 2015 (with English Translation of Categories of Cited Documents).

* cited by examiner

*Primary Examiner* — Roberts Culbert
(74) *Attorney, Agent, or Firm* — Oblon, McClelland, Maier & Neustadt, L.L.P.

(57) ABSTRACT

The invention relates to a method for fabrication of a one-piece, silicon-based component of simple shape offering the illusion of faceting and/or chamfering for forming all or part of the exterior part of a timepiece.

14 Claims, 5 Drawing Sheets

METHOD FOR FABRICATION OF A SILICON-BASED COMPONENT WITH AT LEAST ONE OPTICAL ILLUSION PATTERN

This application claims priority from European Patent application 15194156.4 of Nov. 11, 2015, the entire disclosure of which is hereby incorporated herein by reference.

FIELD OF THE INVENTION

The invention relates to a method for fabrication of a silicon-based component having a flat surface comprising at least one optical illusion pattern and, more specifically, at least one pattern making the flat surface appear not to be flat and/or to contain two types of material.

BACKGROUND OF THE INVENTION

It is known to form external components whose upper surface is faceted and/or chamfered in order to improve the aesthetic appearance of a timepiece. EP Patent 1722281 discloses a method for fabrication of faceted silicon components not requiring a finishing step.

SUMMARY OF THE INVENTION

It is an object of the present invention to overcome all or part of the aforecited drawbacks by proposing a fabrication method that requires neither faceting nor finishing to obtain a simpler silicon-based component offering the illusion of faceting and/or chamfering and/or of a composite component.

To this end, the invention relates to a method for fabrication of at least one silicon-based component with at least one optical illusion pattern, characterized in that it comprises the following steps:
  a) forming a substrate comprising a silicon-based layer;
  b) etching at least one hole through the thickness of the silicon-based layer to form the contour of said at least one component and blind recesses in the thickness of the silicon-based layer to forms said at least one component with a flat surface comprising said at least one optical illusion pattern making said surface appear not to be flat;
  c) releasing said at least one component thereby formed from the substrate.

It is thus understood that, as a result of the flatness of the silicon-based layer, the fabrication method allows a component to be obtained with a flat surface that no longer needs to be subsequently faceted or, more generally, subsequently finished.

Further, the fabrication method offers very high precision of the dimensions and very high reproducibility of a same type of one-piece, silicon-based components, or of several different one-piece, silicon-based components, on the same substrate.

Finally, advantageously according to the invention, the very high precision and very high reproducibility of the fabrication method make it possible to obtain a very simple component, provided with at least one, very fine and easily reproducible pattern making a flat surface appear not to be flat, as though machined, such as by beveling or chamfering.

In accordance with other advantageous variants of the invention:
  according to a first embodiment, the blind recesses form at least two series of parallel segments, the first series of parallel segments joining the second series of parallel segments at an angle comprised between 10 and 170°, such that said at least one component gives the illusion that said flat surface comprises two bevelled surfaces forming an edge;
  according to a second embodiment, the blind recesses form at least one series of curved segments such that said at least one component gives the illusion that said flat surface is domed;
  according to a third embodiment, the blind recesses form at least one series of recesses arranged symmetrically in relation to each other, said at least one series of recesses being formed adjacent to a portion wherein the upper surface of said at least one component has no recess, such that said at least one component gives the illusion that said flat surface comprises two bevelled surfaces forming an edge;
  according to a fourth embodiment, the blind recesses are arranged at the periphery of said at least one component and form at least two series of parallel segments, the parallel segments of the first series being perpendicular to the segments of the second series and joining at an angle such that said at least one component gives the illusion that said flat surface is chamfered;
  according to a fifth embodiment, the blind recesses form at least one series of recesses arranged symmetrically in relation to each other, said at least one series of recesses being bordered by surfaces of said at least one component that have no recess, such that said at least one component gives the illusion that said flat surface is made in relief with two different materials;
  the blind recesses have a depth comprised between 2 and 100 µm;
  the method further comprises, between step b) and step c), step d): forming at least one through hole in the thickness of the rest of the substrate so as to form said at least one component with a securing means;
  the silicon-based layer has a thickness comprised between 50 and 500 µm;
  according to a first alternative, step b) comprises phase e): forming a mask with openings on the silicon-based layer, the opening used to form said at least one through hole being wider than those used to form the blind holes; phase f): etching by means of an anisotropic etch the silicon-based layer through the mask openings and phase g): removing the mask;
  according to a second alternative, step b) comprises phase h): forming a first mask with openings in the shapes of said at least one through hole and of the blind recesses, phase i): forming a second mask on the first mask with at least one opening only in the shape of said at least one through hole, j): partially etching, by means of a first anisotropic etch, the silicon-based layer through said at least one opening in the second mask, k): removing the second mask, l): etching, by means of a second anisotropic etch, the silicon-based layer through the openings in the first mask so as to obtain said at least one through hole and the blind recesses and m): removing the first mask;
  the first silicon-based component contains single crystal silicon, doped single crystal silicon, amorphous silicon, porous silicon, polycrystalline silicon, silicon nitride, silicon carbide, quartz or silicon oxide;
  several components are formed in the same silicon-based layer;
  said at least one component forms all or part of a dial, an aperture decoration, a flange, a bezel, a push-piece, a crown, a case back cover, a hand, a bracelet or strap, a link, a clasp, a decoration, an oscillating weight or an applique.

The invention also relates to the exterior part of a timepiece comprising a silicon-based component obtained by the method according to any of the preceding variants, characterized in that the component has a substantially flat surface with at least one optical illusion pattern making said substantially flat surface appear not to be flat.

BRIEF DESCRIPTION OF THE DRAWINGS

Other features and advantages will appear clearly from the following description, given by way of non-limiting illustration, with reference to the annexed drawings, in which.

DETAILED DESCRIPTION OF PREFERRED EMBODIMENTS

The present invention relates to a method for fabrication of a one-piece, silicon-based component of simple shape offering the illusion of faceting and/or chamfering for forming all or part of the exterior of a timepiece. By way of non-limiting example, the component may thus form all or part of a dial, an aperture decoration, a flange, a bezel, a push-piece, a crown, a case back cover, an oscillating weight, a hand, a bracelet or strap, a link, a clasp, a decoration or an applique.

Naturally, such a component is not limited to the field of horology. By way of non-limiting example, such a component could alternatively form all or part of a piece of jewelry.

The method is for fabricating at least one silicon-based component. The term "silicon-based" means that silicon alone or in compound form may be present in the composition of the component. Thus, by way of non-limiting example, the component(s) may, for example, be formed with single crystal silicon, regardless of crystal orientation, doped single crystal silicon, regardless of crystal orientation, amorphous silicon, porous silicon, polycrystalline silicon, silicon nitride, silicon carbide, quartz, regardless of crystal orientation, or silicon oxide.

Advantageously according to the invention, each silicon-based component obtained by the method comprises at least one optical illusion pattern. More specifically, advantageously, each component comprises a substantially flat surface with at least one optical illusion pattern making said substantially flat surface appear not to be flat, which allows a simple component to be obtained, for example offering the illusion of faceting and/or chamfering and/or of a composite component.

For the sake of simplification, the Figures presented represent the fabrication of only one component on a substrate. However, advantageously according to the invention, the methods enables several identical or different components to be formed on the same substrate.

Figure 1:
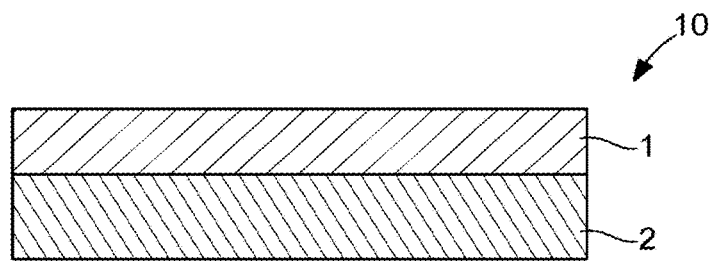
FIGS. 1 to 5 are representations of steps of methods according to the invention.

As seen in FIG. 1, the method according to the invention comprises a first step a) for forming a substrate 10 comprising a silicon-based layer 1 whose thickness is comprised between 50 and 500 µm. In the example illustrated in FIG. 1, it is noted that substrate 10 further comprises a support layer 2 for receiving silicon-based layer 1. According to the variants explained below, support layer 2 may be chosen with regard to the material used or its nature may be of no importance.

Figure 2:
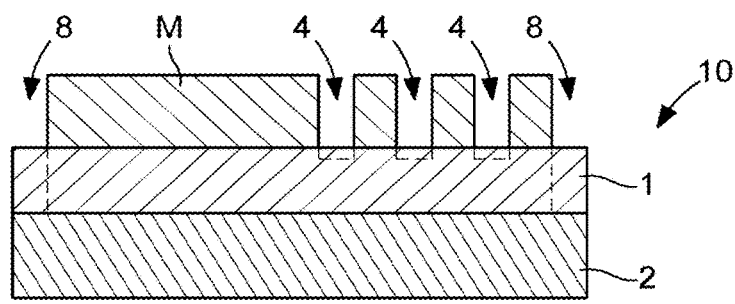

As illustrated in FIG. 2, the method continues with a second step b) for etching at least one hole 6 through the thickness of silicon-based layer 1 to form the body 7 of component 11. This means that, depending on the component 11 to be formed, one or more through holes 6 may be made. The second step b) is also for etching blind recesses 5 in the thickness of silicon-based layer 1 to form said at least one component 11 with a flat surface comprising said at least one optical illusion pattern 14 for making said surface appear not to be flat.

The general shape of said at least one optical illusion pattern 14 will be explained further below. For reasons of intelligibility, blind recesses 5 are schematically represented in FIG. 2 in dotted lines by three hollows in upper surface 3 of silicon-based layer 1.

Further, blind recesses 5 made in layer 1 may extend to a depth comprised between 2 and 100 µm from upper surface 3 of silicon-based layer 1.

As illustrated in FIG. 2, in a first preferred alternative, step b) comprises three phases e) to g). Step b) comprises a first phase e) for forming a mask M with openings 4, 8 on silicon-based layer 1. Preferably, the opening 8 used to form said at least one through hole 6 is wider than those 4 used to form blind recesses 5. Such a phase e) may, for example, be obtained by photolithography of a photosensitive resin, by structuring a layer (like silicon oxide) or by selective deposition of a layer of metal or of silicon nitride. Of course, other methods for forming and/or other materials for the mask are possible.

The first preferred alternative continues with a second phase f) for etching, by means of an anisotropic etch, silicon-based layer 1 through openings 4, 8 in mask M. It is thus understood that the anisotropic etch, such as for example a deep reactive ion etch, will remove the silicon-based material deeper inside said at least one wider opening 8 than inside openings 4. This difference in etching speed advantageously makes it possible to form in the same etch said at least one through hole 6 and blind recesses 5 in silicon-based layer 1.

Finally, step b), according to the first preferred alternative, ends with a third phase g) for removing mask M. This third phase g) is generally obtained by a selective chemical etch of the material used for mask M.

Figure 5:
Figure 6:
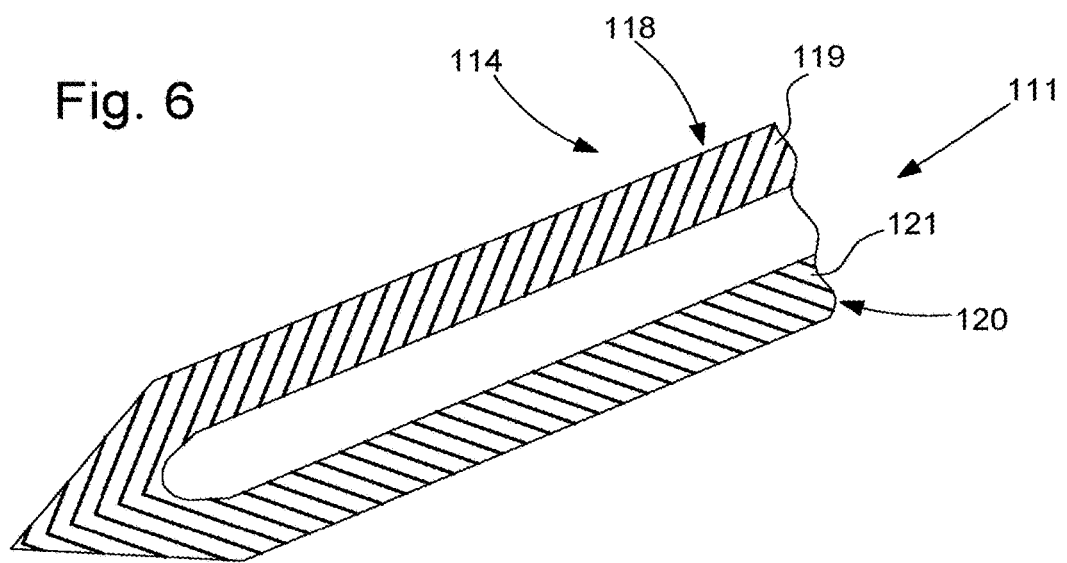
FIGS. 6 to 11 represent examples of hands obtained according to the invention.
Figure 7:
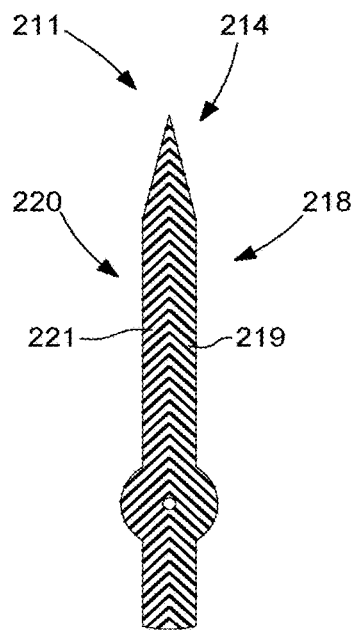

According to a variant of the first alternative, openings 4 corresponding to the shape of the future blind recesses 5 are divided into openings that are several times smaller, as illustrated in FIG. 5. By way of example, the openings that are several times smaller could have a width comprised between 2 and 3 µm separated by an opening-free width comprised between 3 and 5 µm.

Then, after phase g), step b) comprises a phase for oxidising silicon-based layer 1 to completely oxidise the thinnest walls illustrated in FIG. 5, which are formed only in the desired future blind recesses 5. Finally, step b) ends with deoxidation of silicon-based layer 1 to form blind recesses 5. This variant is particularly useful when blind recesses 5 are required to be much more shallow than said at least one through hole 6.

According to a second alternative (not shown), step b) comprises six phases h) to m). Thus, step b) comprises a first phase h) for forming a first mask with openings 4, 8 in the shapes of said at least one through hole 6 and of blind recesses 5. The second alternative continues with a second phase i) for forming a second mask on the first mask with said at least one opening 8 only in the shape of said at least one through hole 6. It is thus understood that openings 4 in the first mask are concealed by the second mask.

The second alternative then comprises a third phase j) for partially etching silicon-based layer 1, i.e. in only one part of the thickness, by means of a first anisotropic etch through said at least one opening 8 in the first and second masks. In a fourth phase k), the second mask is removed, then a fifth phase l) is for etching silicon-based layer 1, by means of a second anisotropic etch, through openings 4, 8 in the first mask, so as to obtain said at least one through hole 6 and blind recesses 5. Finally, the second alternative ends with phase m) for removing the first mask. Although not represented, it is understood that this second alternative makes it possible to achieve the same result as the first alternative without being limited by any difference in widths to be observed between openings 4 and 8.

According to a third alternative (not represented), step b) comprises successive phases of etching said at least one through hole 6 and blind recesses 5, i.e., either first etching said at least one through hole 6 and then blind recesses 5, or vice versa. By way of example, step b) according to the third alternative could thus comprise two processes comprising phases similar to phases e) to g) of the first alternative, each process being for etching said at least one through hole 6 or blind recesses 5. Consequently, it is understood that this third alternative can also obtain the same result as the first and second alternatives.

Advantageously according to the invention, as a result of the very precise photolithography used in step b), the method can produce a silicon-based body 7 with high precision external and possibly internal dimensions capable of satisfying the very high tolerances required for a component in the field of horology. "Internal dimensions" means that, in addition to defining the contour of body 7, said at least one through hole 6 could also form a hole in the body 7 defined in step b), for subsequently receiving a member therein, for example. It is thus understood that there would be several through holes 6 formed in addition to blind recesses 5.

Finally, the method ends with a third and final step c) for releasing the component 11 thereby formed from substrate 10. Consequently, step c) may consist of a selective etch of support layer 2.

Figure 4:
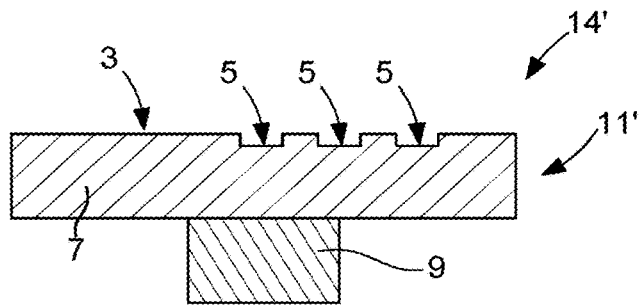

According to another variant of the method illustrated in FIG. 4, the method may also comprise, between step b) and step c), the optional step d) of forming through holes in the thickness of the rest of substrate 10 so as to form a component 11' with a securing means 9.

Because of the precise positioning of each body 7 on substrate 10, it is possible, in step d), to etch layer 2 of substrate 10 with precise dimensions. In this variant, support layer 2 is preferably silicon-based in order to use the same types of etch as in step b) described above. Such a step d) advantageously according to the invention makes it possible to obtain a component 611' as described below with reference to FIG. 18.

It is understood therefore, that in addition to flat surface 3 and recesses 5 forming said at least one optical illusion pattern 14', 614', component 11', 611' also comprises at least one securing 9, 609' for attaching component 11', 611'. Securing means 9, 609' can therefore take the form of a foot or a pipe.

FIGS. 6 to 19 represent examples of components obtained by the method to better explain an optical illusion pattern according to the invention. By way of non-limiting example, four embodiments of the optical illusion pattern are explained.

According to a first embodiment, the optical illusion pattern 114, 214, 514 and 714 of FIGS. 6, 7, 12 and 16, thus form at least two series 118, 120, 218, 220, 518, 520, 718, 720 of parallel segments 119, 121, 219, 221, 519, 521, 719, 721. Preferably according to the first embodiment, the first series 118, 218, 518, 718 of parallel segments 119, 219, 519, 719 join the second series 120, 220, 520, 720 of parallel segments 121, 221, 521, 721 at an angle comprised between 10 and 170° such that component 111, 211, 511, 711 gives the illusion of a visible surface with two bevelled surfaces forming an edge, when it is flat. By way of example, the optical illusion pattern 114, 214, 514 and 714 of FIGS. 6, 7, 12 and 16 could comprise openings having a width comprised between 35 and 45 µm separated by an opening-free width comprised between 30 and 35 µm.

Figure 8:
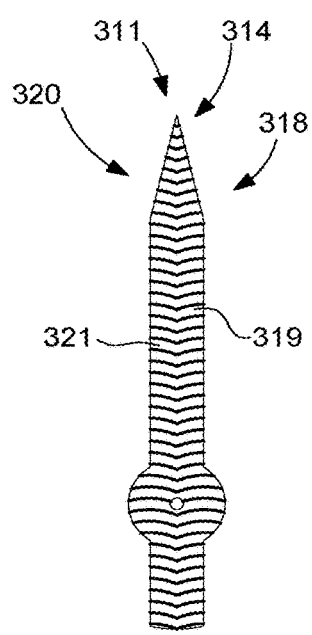
Figure 13:
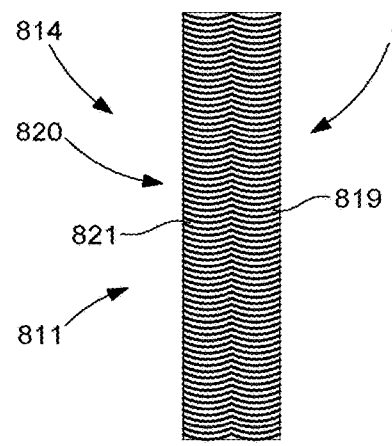
Figures 15, 16, 17:
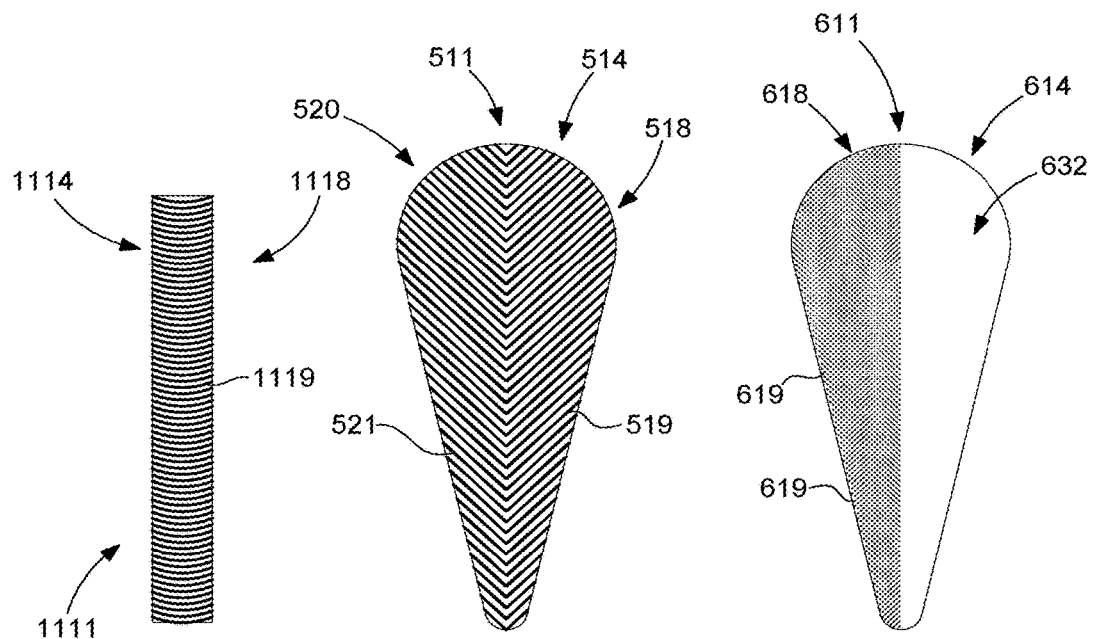

According to a second embodiment, the optical illusion pattern 314, 814 and 1114 of FIGS. 8, 13 and 15 thus forms at least one series 318, 320, 818, 820, 1118 of curved segments 319, 321, 819, 821, 1119, such that component 311, 811, 1111 gives the illusion that the visible surface is domed when it is flat. According to a variant of the second embodiment seen in FIGS. 8 and 13, a first series 318, 818 of curved segments 319, 819 joins a second series 320, 820 of curved segments 321, 821 at an angle comprised between 10 and 170 degrees, such that component 311, 811 gives the illusion that the visible surface comprises two domed surfaces forming a groove, when the surface is flat. By way of example, the optical illusion pattern 314, 814 and 1114 of FIGS. 8, 13 and 15 could comprise openings having a width comprised between 35 and 45 µm separated by an opening-free width comprised between 30 and 35 µm.

Figure 9:
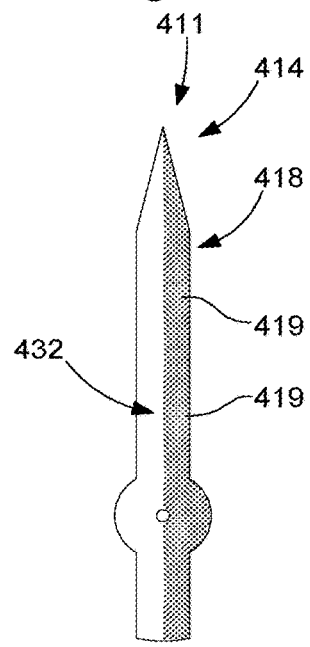

According to a third embodiment, the optical illusion pattern 414 and 614 of FIGS. 9 and 17 thus forms at least one series 418, 618 of recesses 419, 619, arranged symmetrically in relation to each other. Preferably according to the third embodiment, said at least one series 418, 618 of recesses is formed adjacent to a portion 432, 632 wherein the surface of component 411, 611 has no optical illusion pattern, such that component 411, 611 gives the illusion that the visible surface comprises two bevelled surfaces forming an edge, when it is flat. By way of example, the optical illusion pattern of FIGS. 9 and 17 could comprises recesses 419, 619 covering between 40% and 60% of the surface of said pattern 414, 619.

As seen in FIGS. 9 and 17, recesses 419, 619 are of circular cross-section and at a regular distance from each other. Of course, the geometry and arrangement of recesses 419, 619 may differ according to the desired effect without departing from the scope of the invention.

Figure 14:
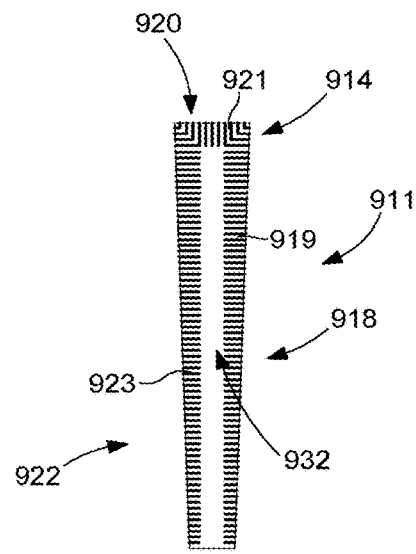
Figure 19:
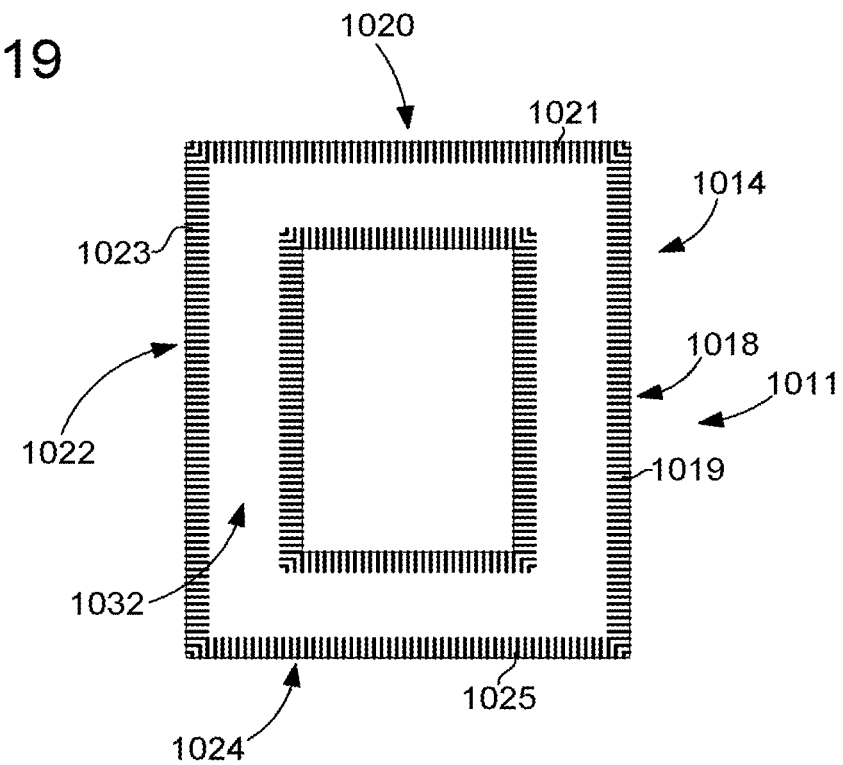
FIG. 19 represents an example of an aperture decoration obtained according to the invention.

According to a fourth embodiment, the optical illusion pattern 914 and 1014 of FIGS. 14 and 19 is arranged at the periphery of component 911, 1011 and thus forms at least two series 918, 920, 922, 1018, 1020, 1022, 1024 of parallel segments 919, 921, 923, 1019, 1021, 1023, 1025, the parallel segments 919, 923, 1019, 1023 of the first series 918, 922, 1018, 1022 being perpendicular to the parallel segments 921, 1021, 1025 of the second series 920, 1020, 1024 and joining at an angle of 90 degrees, such that component 911, 1011 gives the illusion that the visible surface is chamfered and surrounds a portion 932, 1032 where the surface of component 911, 1011 has no optical illusion pattern, when said surface is flat. By way of example, the optical illusion pattern 914 and 1014 of FIGS. 14 and 19 could comprise openings having a width comprised between 35 and 45 μm separated by an opening-free width comprised between 30 and 35 μm.

The angle of 90 degrees is preferably chosen because the external sides of the component 911, 1011 have a similar or an identical angle at each corner. This means that the angle of 90 degrees may be bigger or narrower as function of the angle of each corner so as to make the illusion the visible face is chamfered.

Figure 10:
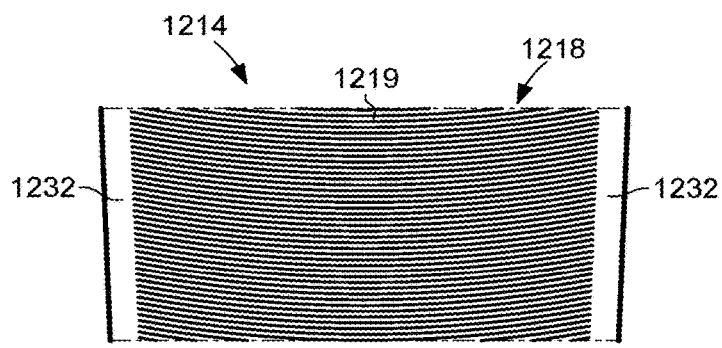
Figure 11:
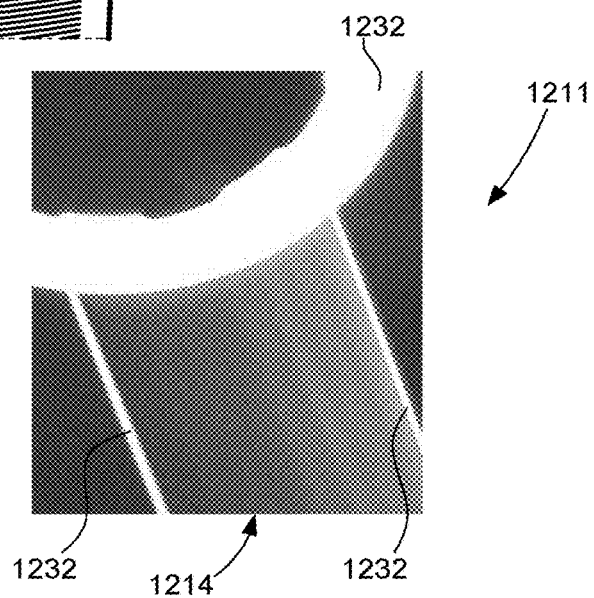
Figure 12:
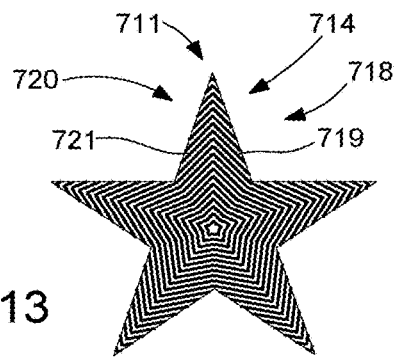
FIGS. 12 to 18 represent examples of hour-symbols obtained according to the invention.

According to a fifth embodiment illustrated in FIGS. 10 and 11, the optical illusion pattern 1214 forms at least one series 1218 of recesses 1219 arranged symmetrically in relation to each other as seen more clearly in FIG. 10. Said at least one series 1218 of recesses is bordered by surfaces 1232 of component 1211 having no recess, such that component 1211 gives the illusion, as illustrated in FIG. 11, that the visible surface is dark and bordered by another light material, when the surface is flat and component 1211 consists of only one silicon-based material. It is understood in fact that optical illusion pattern 1214 behaves like a light trap that limits reflection unlike surfaces 1232. By way of example, the optical illusion pattern 1214 of FIGS. 17 and 18 could comprise openings having a width comprised between 2 and 3 μm separated by an opening-free width comprised between 5 and 9 μm.

According to a variant of the fifth embodiment, component 1211 is also coated with a reflective layer, such as, for example, a chromium-based layer, to further improve the contrast between the dark area formed by optical illusion pattern 1214 and the pattern-free surface(s) 1232.

Of course, the present invention is not limited to the illustrated example but is capable of various variants and modifications that will appear to those skilled in the art. In particular, the optical illusion patterns 14, 114, 214, 314, 414, 514, 614, 714, 814, 914, 1014, 1114 are not limited to those described above. Thus, other embodiments are possible without departing from the scope of the invention.

Figure 18:
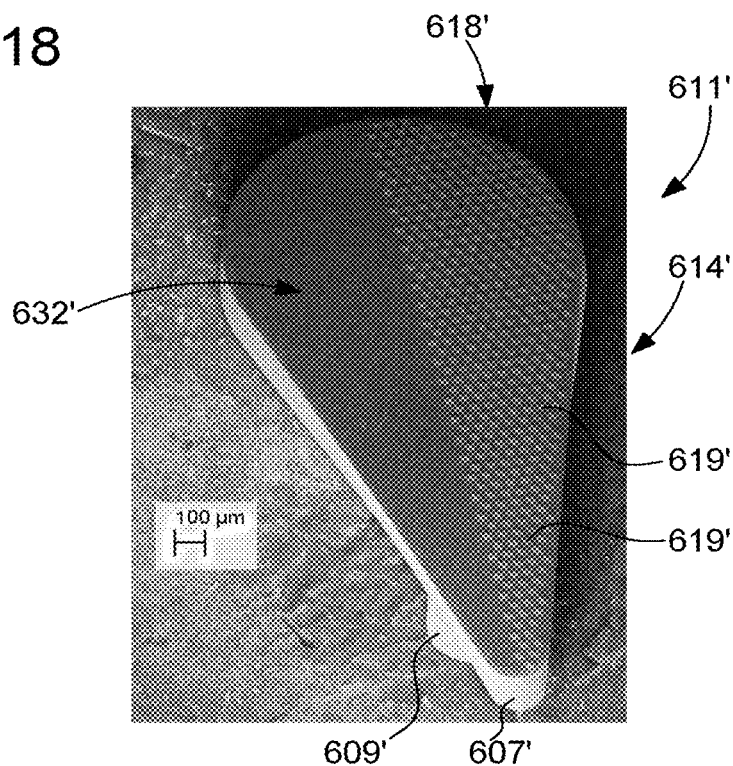

Thus, in a particular variant of the third embodiment illustrated in FIG. 18, optical illusion pattern 614' forms at least one series 618' of recesses 619' arranged symmetrically in relation to each other. As seen in FIG. 18, said at least one series 618' of recesses is formed adjacent to a portion 632' wherein the surface of component 611' has no optical illusion pattern, such that said component gives the illusion that the visible surface comprises two bevelled surfaces forming an edge when it is flat.

Figure 3:
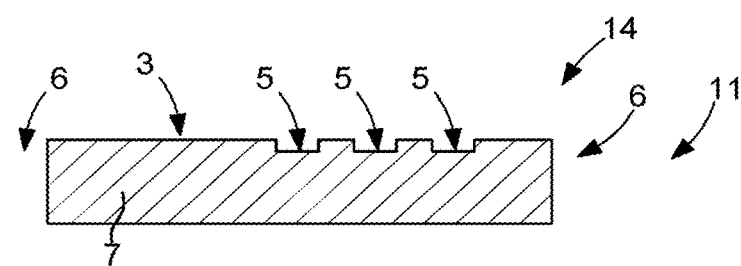

Recesses 619' have a truncated square-based pyramid volume and are regularly spaced from each other. This particular alternative is obtained with a (100)-oriented single crystal silicon layer 1. Further, step b) uses potassium hydroxide (KOH) wet etching to form etches whose sides are oblique and not vertical as illustrated in FIGS. 1 to 3. Indeed, even with an etching mask offering disc-shaped openings, wet etching follows the unit cells of the crystallographic structure of the (100)-oriented single crystal silicon layer 1, giving a square-based pyramid etch.

Further, as seen in FIG. 18, as substrate 10 is of the silicon-on-insulator (SOI) type, layer 2, also made of single crystal silicon, is also etched, for example by a wet or dry etch, to obtain several feet 609' for attaching component 611'.

Finally, the five embodiments presented above are capable of being combined with each other, i.e. several different patterns can appear on the same component.

What is claimed is:

1. A method for fabrication of at least one silicon-based component with at least one optical illusion pattern, wherein the method comprises the following steps:
   a) forming a substrate comprising a silicon-based layer;
   b) etching at least one hole through the thickness of the silicon-based layer to form the contour of the at least one silicon-based component and blind recesses in the thickness of the silicon-based layer to form the at least one silicon-based component with a flat surface comprising the at least one optical illusion pattern making the surface appear not to be flat;
   c) releasing the at least one silicon-based component thereby formed from the substrate.

2. The method according to claim 1, wherein the blind recesses form at least two series of parallel segments, the first series of parallel segments joining the second series of parallel segments at an angle comprised between 10 and 170°, such that the at least one silicon-based component gives the illusion that the flat surface comprises two bevelled surfaces forming an edge.

3. The method according to claim 1, wherein the blind recesses form at least one series of curved such that the at least one silicon-based component gives the illusion that the flat surface is domed.

4. The method according to claim 1, wherein the blind recesses form at least one series of recesses arranged symmetrically in relation to each other, the at least one series of recesses being formed adjacent to a portion wherein the flat surface of the at least one silicon-based component has no recess, such that the at least one silicon-based component gives the illusion that the flat surface comprises two bevelled surfaces forming an edge.

5. The method according to claim 1, wherein the blind recesses are arranged at the periphery of the at least one silicon-based component and form at least two series of parallel segments, the parallel segments of the first series being perpendicular to the parallel segments of the second series and joining at an angle such that the at least one silicon-based component gives the illusion that the flat surface is chamfered.

6. The method according to claim 1, wherein the blind recesses form at least one series of recesses arranged symmetrically in relation to each other, the at least one series of recesses being bordered by surfaces of the at least one silicon-based component having no recess, such that the at least one silicon-based component gives the illusion that the flat surface is formed in relief with two different materials.

7. The method according to claim 1, wherein the depth of the blind recesses is comprised between 2 and 100 μm.

8. The method according to claim 1, wherein, between step b) and step c), the method further comprises the following step:
   d) forming at least one through hole in the thickness of the rest of the substrate to form the at least one silicon-based component with a securing means.

9. The method according to claim 1, wherein the silicon-based layer has a thickness comprised between 50 and 500 μm.

10. The method according to claim 1, wherein step b) comprises the following phases:
   e) forming a mask with openings) on the silicon-based layer, the opening used to form the at least one through hole being wider than those used to form the blind recesses;

f) etching the silicon-based layer, by means of an anisotropic etch, through the openings in the mask;

g) removing the mask.

11. The method according to claim 1, wherein step b) comprises the following phases:

h) forming a first mask with openings in the shapes of the at least one through hole and of the blind recesses;

i) forming a second mask on the first mask with at least one opening only in the shape of the at least one through hole;

j) partially etching the silicon-based layer, by means of a first anisotropic etch, through the at least one opening in the second mask;

k) removing the second mask;

l) etching the silicon-based layer, by means of a second anisotropic etch, through the openings in the first mask, so as to obtain the at least one through hole and the blind recesses;

m) removing the first mask.

12. The method according to claim 1, wherein the at least one silicon-based component contains single crystal silicon, doped single crystal silicon, amorphous silicon, porous silicon, polycrystalline silicon, silicon nitride, silicon carbide, quartz or silicon oxide.

13. The method according to claim 1, wherein several silicon-based components are formed in the same silicon-based layer.

14. The method according to claim 1, wherein the at least one silicon-based component forms all or part of a dial, an aperture decoration, a flange, a bezel, a push-piece, a crown, a case back cover, a hand, a bracelet or strap, a link, a clasp, a decoration, an oscillating weight or an applique.

* * * * *